US008928394B2

(12) United States Patent
Park

(10) Patent No.: US 8,928,394 B2
(45) Date of Patent: Jan. 6, 2015

(54) SEMICONDUCTOR INTEGRATED CIRCUIT AND AN OPERATING METHOD THEREOF, A TIMING VERIFYING METHOD FOR A SEMICONDUCTOR INTEGRATED CIRCUIT AND A TEST METHOD OF A SEMICONDUCTOR INTEGRATED CIRCUIT

(71) Applicant: Samsung Electronics Co., Ltd., Suwon-si, Gyeonggi-Do (KR)

(72) Inventor: Hyoun Soo Park, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/027,618

(22) Filed: Sep. 16, 2013

(65) Prior Publication Data

US 2014/0132334 A1   May 15, 2014

(30) Foreign Application Priority Data

Nov. 9, 2012   (KR) ........................ 10-2012-0126871

(51) Int. Cl.
*H01L 35/00*   (2006.01)
*G06F 1/32*   (2006.01)
*G11C 5/14*   (2006.01)
*G06F 1/20*   (2006.01)

(52) U.S. Cl.
CPC ............... *G06F 1/3206* (2013.01); *G11C 5/14* (2013.01); *G06F 1/206* (2013.01); *G06F 1/324* (2013.01); *G06F 1/3296* (2013.01)
USPC ........................................................ 327/513

(58) Field of Classification Search
CPC ................................ G05F 1/462; G05F 1/463
USPC .................................................. 327/512, 513
See application file for complete search history.

(56) References Cited

U.S. PATENT DOCUMENTS 5,723,998 A * 3/1998 Saito et al. .................... 327/513
6,363,490 B1 * 3/2002 Senyk ........................... 713/300

(Continued)

FOREIGN PATENT DOCUMENTS

JP   2009284045   12/2009
JP   2010071290   4/2010

(Continued)

OTHER PUBLICATIONS

David Brooks et al, "Dynamic Thermal Management for High-Performance Microprocessors", Proceedings of the 7th International Symposium on High-Performance Computer Architecture, Monterrey, Mexico, Jan. 2001.

*Primary Examiner* — Jeffrey Zweizig
(74) *Attorney, Agent, or Firm* — F. Chau & Associates, LLC

(57) ABSTRACT

A semiconductor integrated circuit which includes a control circuit; and a power management integrated circuit (IC) configured to supply an operating voltage to the control circuit. The control circuit includes a clock generator; a processor unit; a temperature sensor; a body bias generator; and a controller. The controller controls the power management IC and the clock generator when temperature data indicates a temperature higher than a high temperature and controls the power management IC or the body bias generator when the temperature data indicates a temperature lower than a low temperature. The high temperature is lower than a hot temperature of the control circuit and the low temperature is higher than a cold temperature of the control circuit and lower than the high temperature.

19 Claims, 9 Drawing Sheets

(56) References Cited

U.S. PATENT DOCUMENTS

| | | | |
|---|---|---|---|
| 6,484,265 B2 * | 11/2002 | Borkar et al. | 713/324 |
| 6,885,233 B2 * | 4/2005 | Huard et al. | 327/513 |
| 7,050,959 B1 | 5/2006 | Pollard, II et al. | |
| 7,460,932 B2 | 12/2008 | Johns et al. | |
| 7,461,182 B2 | 12/2008 | Fukushima et al. | |
| 7,463,993 B2 | 12/2008 | Finkelstein et al. | |
| 7,464,278 B2 | 12/2008 | Cohen et al. | |
| 7,464,355 B2 | 12/2008 | Yoshimura | |
| 7,487,012 B2 | 2/2009 | Bose et al. | |
| 7,555,740 B2 | 6/2009 | Buck et al. | |
| 7,661,003 B2 | 2/2010 | Naffziger et al. | |
| 7,761,191 B1 | 7/2010 | Wagner | |
| 8,027,798 B2 | 9/2011 | Johns et al. | |
| 8,086,358 B2 | 12/2011 | O'Neil et al. | |
| 8,105,804 B2 | 1/2012 | Mintier et al. | |
| 8,316,250 B2 | 11/2012 | Trautman et al. | |
| 8,547,164 B2 * | 10/2013 | Flores et al. | 327/513 |
| 8,766,704 B2 * | 7/2014 | Takayanagi | 327/513 |
| 2008/0005591 A1 | 1/2008 | Trautman et al. | |
| 2010/0115293 A1 | 5/2010 | Rotem et al. | |

FOREIGN PATENT DOCUMENTS

| | | |
|---|---|---|
| JP | 4479420 | 6/2010 |
| JP | 2011113302 | 6/2011 |
| KR | 1020100131714 | 12/2010 |
| KR | 1020110055549 | 5/2011 |
| WO | 2010019147 | 2/2010 |

* cited by examiner

Fig. 7

| VDD | Cell | Wire | Timing Check |
|---|---|---|---|
| VDD − α% | Worst / $T_{cold}$ | Worst / $T_{cold}$ | Hold |
|  | Worst / $T_{low}$ | Worst / $T_{low}$ | Setup |
|  | Worst / $T_{hot}$ | Worst / $T_{hot}$ | Setup & Hold |
| VDD + α% | Best / $T_{cold}$ | Best / $T_{cold}$ | Hold |
|  | Best / $T_{low}$ | Best / $T_{low}$ | Setup |
|  | Best / $T_{hot}$ | Best / $T_{hot}$ | Setup & Hold |

US 8,928,394 B2

SEMICONDUCTOR INTEGRATED CIRCUIT AND AN OPERATING METHOD THEREOF, A TIMING VERIFYING METHOD FOR A SEMICONDUCTOR INTEGRATED CIRCUIT AND A TEST METHOD OF A SEMICONDUCTOR INTEGRATED CIRCUIT

CROSS-REFERENCE TO RELATED APPLICATION

This U.S. non-provisional patent application claims priority under 35 U.S.C. §119 to Korean Patent Application No. 10-2012-0126871 filed Nov. 9, 2012, in the Korean Intellectual Property Office, the disclosure of which is incorporated by reference herein in its entirety.

BACKGROUND

1. Technical Field

The inventive concept relates to a semiconductor integrated circuit, an operating method of a semiconductor integrated circuit, and timing verifying and testing methods of a semiconductor integrated circuit.

2. Discussion of the Related Art

High performance electronic products may include high-speed semiconductor devices. A heat value of a semiconductor device may increase when the semiconductor device operates at a high speed. If a temperature becomes higher than a predetermined threshold temperature due to an increase in the heat value of the semiconductor device, an operating speed of the semiconductor device may decrease. This may lower the reliability of the semiconductor device and cause the semiconductor device to abnormally operate. Further, the semiconductor device may be overheated and thus physically damaged.

An operating voltage of the semiconductor device may decrease due to a process technique of forming the semiconductor device. In this case, as a temperature of the semiconductor device decreases, an operating speed of the semiconductor device may slow.

SUMMARY

An exemplary embodiment of the inventive concept provides a semiconductor integrated circuit comprising a control circuit; and a power management integrated circuit (IC) configured to supply an operating voltage to the control circuit. The control circuit comprises a clock generator configured to generate a clock signal; a processor unit configured to operate in response to the clock signal and to operate the control circuit; a temperature sensor configured to sense a temperature of the control circuit to generate temperature data; a body bias generator configured to supply a body bias voltage to the processor unit; and a controller configured to receive the temperature data from the temperature sensor. The controller controls the power management IC and the clock generator when the temperature data indicates a temperature higher than a high temperature and controls the power management IC or the body bias generator when the temperature data indicates a temperature lower than a low temperature. The high temperature is lower than a hot temperature of the control circuit and the low temperature is higher than a cold temperature of the control circuit and lower than the high temperature.

In an exemplary embodiment of the inventive concept, if the temperature data indicates a temperature lower than the low temperature, the controller controls the power management IC to increase the operating voltage.

In an exemplary embodiment of the inventive concept, if the temperature data indicates a temperature lower than the low temperature, the controller controls the body bias generator to supply a forward body bias voltage to the processor unit.

In an exemplary embodiment of the inventive concept, if the temperature data indicates a temperature higher than the high temperature, the controller controls the power management IC to decrease the operating voltage and the clock generator to decrease a frequency of the clock signal.

In an exemplary embodiment of the inventive concept, if the temperature data indicates a temperature higher than the high temperature, the frequency of the clock signal is decreased before the operating voltage is decreased.

In an exemplary embodiment of the inventive concept, at power-up of the control circuit, the controller controls the power management IC to supply the control circuit with an operating voltage higher than an operating voltage supplied to the control circuit at a normal operation.

In an exemplary embodiment of the inventive concept, at power-up of the control circuit, the controller controls the clock generator to lower a frequency of the clock signal.

In an exemplary embodiment of the inventive concept, at power-up of the control circuit, the controller controls the body bias generator to supply a forward body bias voltage to the processor unit.

An exemplary embodiment of the inventive concept provides an operating method of a semiconductor integrated circuit which includes a control circuit. The operating method comprises receiving power at the control circuit; operating the control circuit at an initial condition in response to the received power; sensing a temperature of the control circuit at a normal operation of the control circuit; determining whether the sensed temperature of the control circuit is higher than a high temperature or lower than a low temperature; and controlling an operating voltage of the control circuit according to the determination result. The high temperature is lower than a hot temperature of the control circuit and the low temperature is higher than a cold temperature of the control circuit and lower than the high temperature.

In an exemplary embodiment of the inventive concept, controlling the operating voltage of the control circuit according to the determination result comprises instructing a power management IC of the semiconductor integrated circuit to increase the operating voltage when the sensed temperature of the control circuit is lower than the low temperature.

In an exemplary embodiment of the inventive concept, controlling the operating voltage of the control circuit according to the determination result comprises decreasing a frequency of a clock signal generated by the control circuit when the sensed temperature of the control circuit is higher than the high temperature; and instructing a power management IC of the semiconductor integrated circuit to decrease the operating voltage when the sensed temperature of the control circuit is higher than the high temperature.

An exemplary embodiment of the inventive concept provides a timing verifying method of a semiconductor integrated circuit which includes a control circuit. The timing verifying method comprises receiving a first operating voltage at the control circuit; setting a temperature of the control circuit to a hot temperature, a cold temperature or a low temperature higher than the cold temperature and lower than the hot temperature; verifying a setup/hold time of the semiconductor integrated circuit at the hot temperature, the cold temperature or the low temperature; receiving a second operating voltage at the control circuit; setting a temperature of the control circuit to the hot temperature, the cold temperature or the low temperature; and verifying a setup/hold time of the semiconductor integrated circuit at the hot temperature, the cold temperature or the low temperature.

In an exemplary embodiment of the inventive concept, the first operating voltage is lower than the second operating voltage.

An exemplary embodiment of the inventive concept provides a test method of a semiconductor integrated circuit which includes a control circuit. The test method comprises receiving an operating voltage at the control circuit; setting a temperature of the control circuit to a hot temperature; checking an operating speed of the control circuit at the hot temperature at the received operating voltage; setting a temperature of the control circuit to a low temperature higher than a cold temperature and lower than the hot temperature; and checking an operating speed of the control circuit at the low temperature at the received operating voltage.

In an exemplary embodiment of the inventive concept, the test method further comprises comparing an operating speed of the control circuit at the hot temperature and an operating speed of the control circuit at the low temperature; and storing the operating speed at the hot temperature or the low temperature according to the comparison result.

An exemplary embodiment of the inventive concept, provides a semiconductor integrated circuit that includes a control circuit; and a power management circuit, wherein the control circuit is configured to reduce a speed of a clock signal and the power management circuit is configured to reduce a level of an operating voltage supplied to the control circuit in response to a temperature of the control circuit exceeding a first temperature threshold, wherein the first temperature threshold is lower than a maximum operating temperature of the control circuit and greater than a minimum operating temperature of the control circuit.

The control circuit is configured to generate a bias body voltage or the power management circuit is configured to increase the level of the operating voltage in response to the temperature of the control circuit being lower than a second temperature threshold, the second temperature threshold being less than the first temperature threshold and greater than the minimum operating temperature of the control circuit.

The semiconductor integrated circuit further comprises a timing verifying unit.

The control circuit includes a controller configured to control the power management circuit to adjust the level of the operating voltage and to control a clock generator to adjust the speed of the clock signal.

The controller is configured to control a body bias generator to generate a body bias voltage.

BRIEF DESCRIPTION OF THE DRAWINGS

The above and other features of the inventive concept will become more apparent by describing in detail exemplary embodiments thereof with reference to the attached drawings.

FIG. 7 is a table for describing a timing verifying method of a semiconductor integrated circuit of FIG. 6, according to an exemplary embodiment of the inventive concept.

DETAILED DESCRIPTION OF THE EMBODIMENTS

Figure 1:
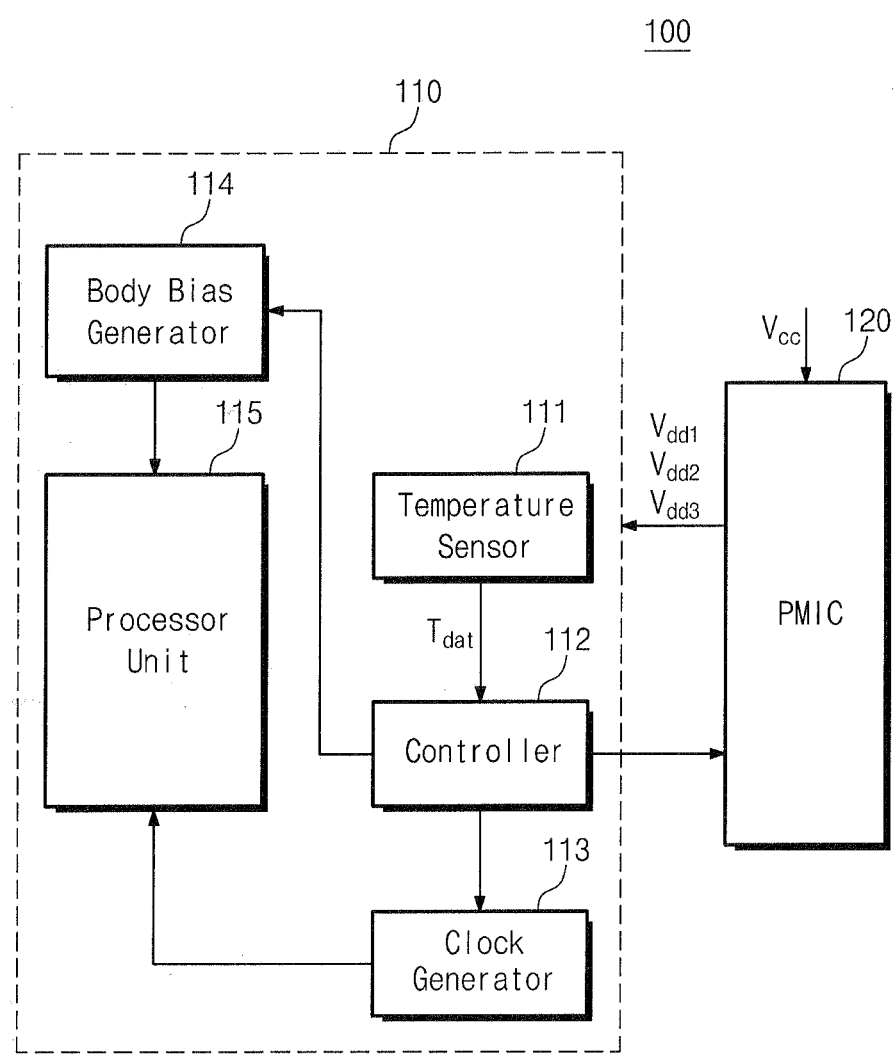
FIG. 1 is a block diagram illustrating a semiconductor integrated circuit according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited to the illustrated embodiments. Like reference numerals may denote like elements throughout the attached drawings and written description.

As used herein, the singular forms "a," "an" and "the" are intended to include the plural forms as well, unless the context clearly indicates otherwise.

It will be understood that when an element or layer is referred to as being "on," "connected to," "coupled to," or "adjacent to" another element or layer, it can be directly on, connected, coupled, or adjacent to the other element or layer, or intervening elements or layers may be present.

FIG. 1 is a block diagram illustrating a semiconductor integrated circuit according to an exemplary embodiment of the inventive concept.

Referring to FIG. 1, a semiconductor integrated circuit 100 according to an exemplary embodiment of the inventive concept may include a control circuit 110 and a power management integrated circuit (IC) 120. The control circuit 110 and the power management IC 120 may be formed of an on-chip. For example, a system-on-chip. The control circuit 110 may be an application processor (AP), for example. In this case, the semiconductor integrated circuit 100 may be formed of a mobile electronic device including an application processor and a power management IC. For example, the mobile electronic device may include various electronic devices such as a cellular phone, a personal digital assistant (PDA), a portable game machine, an e-book, and so on. Further, the application processor can be configured to include the control circuit 110 and the power management IC 120.

The control circuit 110 may be supplied with operating voltages $V_{dd1}$, $V_{dd2}$, and $V_{dd3}$ (e.g., $V_{dd1} \geq V_{dd2} \geq V_{dd3}$) from the power management IC 120. Below, power-up and normal operating states of the control circuit 110 will be described, respectively. The power-up state may be a state starting from a point of time when an operating voltage is supplied to the control circuit 110 from the power management IC 120 until a point of time when the control circuit 110 reaches a normal operation. The normal operating state may be a state in which an operating voltage is sufficiently supplied to the control circuit 110 such that the control circuit 110 is able to operate normally.

The control circuit 110 may include a temperature sensor 111, a controller 112, a clock generator 113, a body bias generator 114, and a processor unit 115, which are formed of an on-chip.

The temperature sensor 111 may sense a temperature of the control circuit 110. The temperature sensor 111 may be formed of a thermo electromotive force (or, thermo element) sensor using an electromotive force that varies according to a temperature, a thermal conduction sensor for sensing a resistance value that varies according to a temperature, and so on. However, the inventive concept is not limited thereto. The temperature sensor 111 may transfer temperature data $T_{dat}$ of the sensed temperature to the controller 112. For example, digital temperature data $T_{dat}$ may be sent to the controller 112.

The controller 112 may store dynamic voltage frequency scaling (DVFS) information predetermined to set an operating voltage of the control circuit 110. The DVFS information may include a correlation between an operating voltage supplied to the control circuit 110 and a frequency of a clock signal which the clock generator 113 generates according to the operating voltage. The frequency of the clock signal may decide an operating speed of the control circuit 110.

The controller 112 may control the operating voltage supplied to the control circuit 110 by using the DVFS information. There may be a case that when a temperature of the control circuit 110 is varied, an operating speed of the control circuit 110 at a specific operating voltage based on the DVFS information is not secured. Such a case may include a case where a temperature of the control circuit 110 exceeds a high temperature or a case where a temperature of the control circuit 110 is below a low temperature. The controller 112 may control a temperature of the control circuit 110 through the following operation.

The controller 112 may selectively control the clock generator 113, the power management IC 120 and the body bias generator 114 based on the temperature data $T_{dat}$ from the temperature sensor 111. The controller 112 may selectively control the clock generator 113, the power management IC 120 and the body bias generator 114 such that a temperature is controlled to be within a constant range at a normal operating state.

The constant range may be previously decided. For example, the controller 112 may set a high temperature $T_{high}$ for preventing an excessive increase in a temperature of the control circuit 110 and a low temperature $T_{low}$ for preventing an excessive decrease in a temperature of the control circuit 110. The low temperature $T_{low}$ may be higher than a cold temperature $T_{cold}$ and lower than the high temperature $T_{high}$. A hot temperature $T_{hot}$ may be higher than the high temperature $T_{high}$. The hot temperature $T_{hot}$ and the cold temperature $T_{cold}$ may be temperatures for deciding a temperature range where the control circuit 110 operates. The hot temperature $T_{hot}$ and the cold temperature $T_{cold}$ may be previously decided at a design level of the control circuit 110. For example, the hot temperature $T_{hot}$ may be a maximum temperature at which it is safe to operate the control circuit 110 and the cold temperature $L_{cold}$ may be a minimum temperature at which it is safe to operate the control circuit 110.

When the temperature data $T_{dat}$ transferred from the temperature sensor 111 indicates a temperature higher than the high temperature $T_{high}$, the controller 112 may control the clock generator 113 such that a frequency of a clock signal generated by the clock generator 113 decreases. In the event that a frequency of a clock signal generated by the clock generator 113 decreases, an operating speed of the control circuit 110 may be lowered, so that a temperature of the control circuit 110 decreases.

When the temperature data $T_{dat}$ transferred from the temperature sensor 111 indicates a temperature higher than the high temperature $T_{high}$, the controller 112 may control the power management IC 120 such that an operating voltage $V_{dd2}$ supplied to the control circuit 110 is lowered. For example, an operating voltage $V_{dd3}$ lower than the operating voltage $V_{dd2}$ may be supplied to the control circuit 110 from the power management IC 120. As an operating voltage supplied to the control circuit 110 is lowered, a temperature of the control circuit 110 may decrease.

When the temperature data $T_{dat}$ transferred from the temperature sensor 111 indicates a temperature lower than the low temperature $T_{low}$, the controller 112 may control the power management IC 120 such that the operating voltage $V_{dd2}$ supplied to the control circuit 110 increases. In addition, when the temperature data $T_{dat}$ transferred from the temperature sensor 111 indicates a temperature lower than the low temperature $T_{low}$, the control circuit 110 may control the body bias generator 114 such that a forward body bias voltage is supplied to the processor unit 115. As an operating voltage supplied to the control circuit 110 is raised or a forward body bias voltage is supplied to the processor unit 115, a temperature of the control circuit 110 may increase.

The controller 112 may control the power management IC 120 such that the control circuit 110 is supplied with an operating voltage $V_{dd1}$ higher than the operating voltage $V_{dd2}$, supplied at the normal operating state, at power-up. In addition, the controller 112 may control the clock generator 113 such that a frequency of a clock signal is lowered at power-up of the control circuit 110.

The clock generator 113 may generate a clock signal needed to drive the control circuit 110 according to a control of the controller 112. For example, the generated clock signal may be supplied to the processor unit 115 to drive an overall operation of the processor unit 115. The clock generator 113 may be formed of a phase locked loop. However, the inventive concept is not limited thereto. For example, various types of clock generating circuits may be used as the clock generator 113 of the inventive concept. The clock generator 113 may change a frequency $F_{clk}$ of the clock signal according to a control of the controller 112.

The body bias generator 114 may supply a forward body bias voltage to the processor unit 115 according to a control of the controller 112. For example, the forward body bias voltage may be supplied to MOS transistors of the processor unit 115.

The processor unit 115 may operate based on the clock signal from the clock generator 113. The processor unit 115 may perform various operations for the control circuit 110. The processor unit 115 may include a Central Processing Unit (CPU) and a Graphic Processing Unit (GPU), for example. Each of the CPU and GPU may generate a clock signal. Each of the CPU and GPU may change a frequency of a clock signal under a control of the controller 112. The processor unit 115 is formed of a plurality of NMOS transistors and a plurality of PMOS transistors.

The power management IC 120 may supply an operating voltage (e.g., $V_{dd1}$, $V_{dd2}$, or $V_{dd3}$) to the control circuit 110 in response to a control of the controller 112. The power management IC 120 may be supplied with a supply voltage $V_{cc}$ from an external device.

As described above, the semiconductor integrated circuit 100 according to an exemplary embodiment of the inventive concept may control a temperature of the control circuit 110 within a constant range. For example, the semiconductor integrated circuit 100 may control a temperature of the control circuit 110 to remain between the high temperature $T_{high}$ and the low temperature $T_{low}$. Thus, it is possible to prevent the control circuit 110 from abnormally operating and physical damage to the control circuit 110 due to an excessive increase in temperature. In addition, it is possible to prevent a decrease in an operating speed of the control circuit 110 due to an excessive decrease in temperature.

Figure 2:
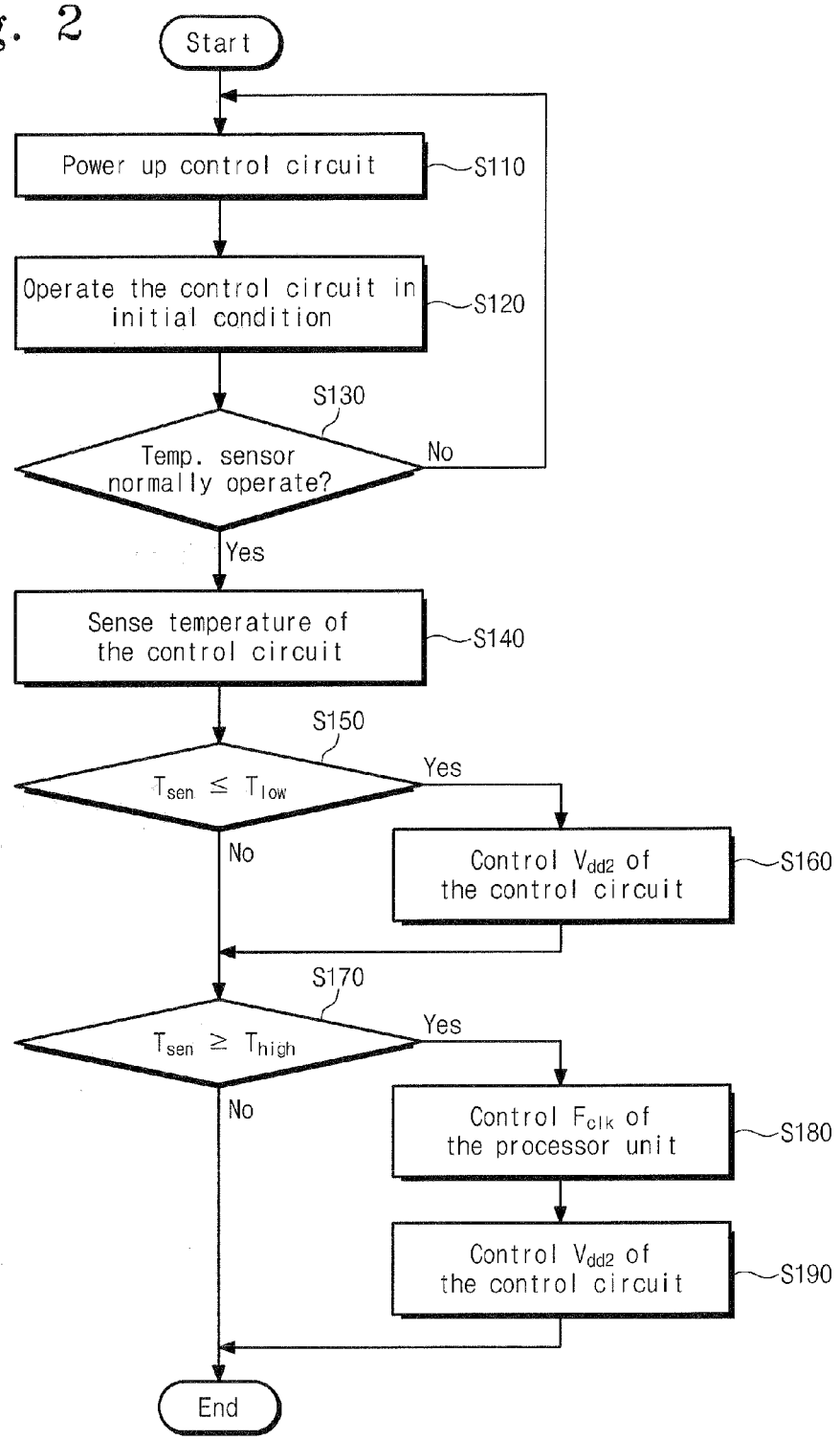
FIG. 2 is a flowchart illustrating an operating method of a semiconductor integrated circuit according to an exemplary embodiment of the inventive concept.

FIG. 2 is a flowchart illustrating an operating method of a semiconductor integrated circuit according to an exemplary embodiment of the inventive concept. In FIG. 2, there is illustrated an example in which the controller 112 (refer to FIG. 1) controls the power management IC 120 (refer to FIG. 1) and the clock generator 113 (refer to FIG. 1) according to a temperature of the control circuit 110 (refer to FIG. 1).

Referring to FIG. 2, an operating method of a semiconductor integrated circuit according to an exemplary embodiment of the inventive concept may include supplying power to the control circuit 110 from the power management IC 120 to power up the control circuit 110 (S110); operating the control circuit 110 at an initial condition (S120); determining whether the temperature sensor 111 (refer to FIG. 1) operates normally (S130); when the temperature sensor 111 operates normally, sensing a temperature $T_{sen}$ of the control circuit 110 (S140); determining whether the temperature $T_{sen}$ of the control circuit 110 is lower than the low temperature $T_{low}$ (S150); and determining whether the temperature $T_{sen}$ of the control circuit 110 is higher than the high temperature $T_{high}$ (S170).

In the event that a determination result of operation S150 indicates that the temperature $T_{sen}$ of the control circuit 110 is lower than the low temperature $T_{low}$, the operating method may further comprise controlling the operating voltage $V_{dd2}$ of the control circuit 110 (S160).

In the event that a determination result of operation S170 indicates that the temperature $T_{sen}$ of the control circuit 110 is higher than the high temperature $T_{high}$, the operating method may further comprise controlling a frequency $F_{clk}$ of a clock signal of the clock generator 113 (S180); and controlling the operating voltage $V_{dd2}$ of the control circuit 110 (S190).

An order of operations S150 and S170 may be changed according to a temperature sensed by the control circuit 110.

Below, each operation will be more fully described.

In operation S110, an operating voltage may start to be supplied to the control circuit 110 to power up the control circuit 110.

In operation S120, the initial condition may be a condition in which the control circuit 110 is supplied with the operating voltage $V_{dd1}$. For example, the controller 112 may control the power management IC 120 to supply the control circuit 110 with the operating voltage $V_{dd1}$ at power-up, wherein the operating voltage $V_{dd1}$ is higher than the operating voltage $V_{dd2}$ supplied to the control circuit 110 at a normal operating state. At power-up, the reason that the operating voltage $V_{dd1}$ higher than the operating voltage $V_{dd2}$ is supplied to the control circuit 110 may be to compensate for the lowering of the performance (e.g., a decrease in an operating speed) of the control circuit 110 in a case where a temperature of the control circuit 110 is lower than the low temperature $T_{low}$ before the temperature sensor 111 can normally operate (e.g., be supplied with a sufficient operating voltage).

In addition, the initial condition may be a condition in which the clock generator 113 generates a clock signal at power-up of the control circuit 110 to have a frequency lower than a frequency of a clock signal at a normal state of the control circuit 110. For example, the controller 112 may control the clock generator 113 such that a frequency of a clock signal is lowered.

In operation S130, the controller 112 may determine whether the temperature sensor 111 operates normally. For example, the controller 112 may determine whether the temperature sensor 111 operates normally, based on whether temperature data $T_{dat}$ is transferred from the temperature sensor 111. If the temperature sensor 111 does not operate normally, the method may proceed to operation S110.

In operation S140, the temperature sensor 111 may sense a temperature of the control circuit 110. The control circuit 110 may transfer temperature data $T_{dat}$ corresponding to the sensed temperature to the controller 112.

In operation S150, the controller 112 may determine whether the temperature data $T_{dat}$ transferred from the temperature sensor 111 indicates a temperature lower than the low temperature $T_{low}$.

In operation S160, when the temperature is lower than the low temperature $T_{low}$, the controller 112 may control the operating voltage $V_{dd2}$ transferred to the control circuit 110. For example, the controller 112 may control the power management IC 120 such that the operating voltage $V_{dd2}$ of the control circuit 110 increases. Under a control of the controller 112, the operating voltage $V_{dd2}$ of the control circuit 110 may be changed to have the same level as that of the operating voltage $V_{dd1}$ at power-up, to have a level lower than that of the operating voltage $V_{dd1}$ but greater than $V_{dd2}$ or to have a level higher than that of the operating voltage $V_{dd1}$. The controller 112 may control the power management IC 120 such that the operating voltage $V_{dd2}$ maintains an increased level until the temperature data $T_{dat}$ indicates a temperature higher than the low temperature $T_{low}$.

In operation S170, when the temperature is higher than the low temperature $T_{low}$, the controller 112 may determine whether the temperature data $T_{dat}$ indicates a temperature higher than the high temperature $T_{high}$.

In operation S180, when the temperature is higher than the high temperature $T_{high}$, the controller 112 may control a frequency $F_{clk}$ of a clock signal generated by the clock generator 113. For example, the controller 112 may control the clock generator 113 such that a frequency $F_{clk}$ of the clock signal is lowered.

In operation S190, when the temperature is higher than the high temperature $T_{high}$, the controller 112 may control the operating voltage $V_{dd2}$ supplied to the control circuit 110. For example, the controller 112 may control the power management IC 120 such that the operating voltage $V_{dd2}$ of the control circuit 110 decreases. The controller 112 may control the power management IC 120 such that the operating voltage $V_{dd2}$ maintains a decreased level (e.g., $V_{dd3}$) until the temperature data $T_{dat}$ indicates a temperature lower than the high temperature $T_{high}$.

In exemplary embodiments of the inventive concept, operation S140 can be iteratively performed after operations S170 and S190 are ended.

Figure 3:
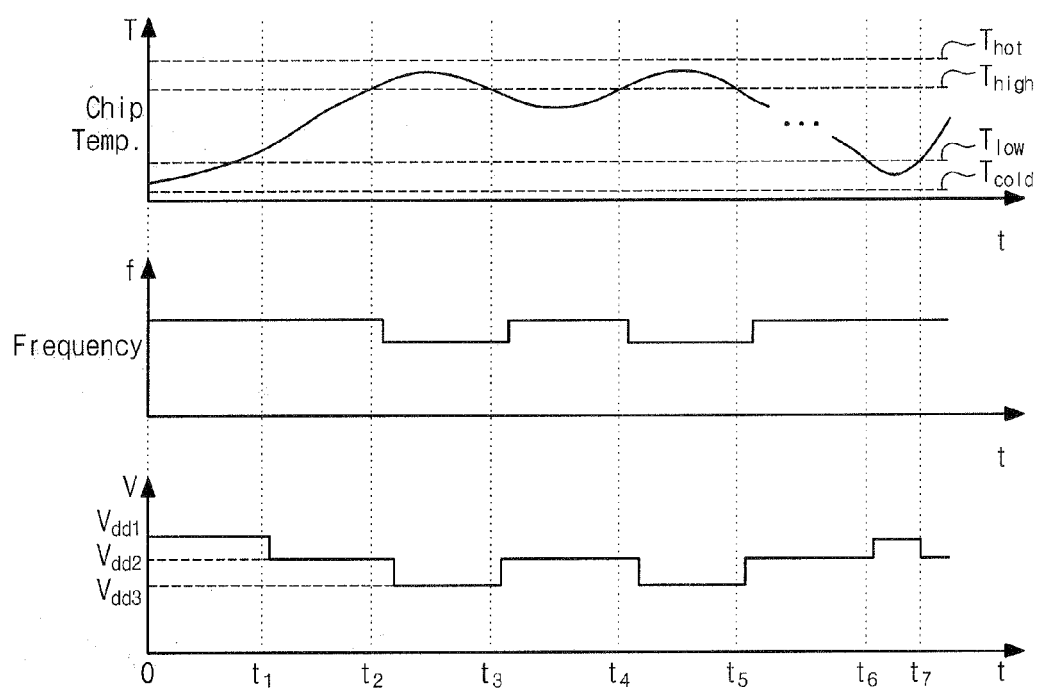
FIG. 3 is a timing diagram for describing a normal operation of a semiconductor integrated circuit of FIG. 1, according to an exemplary embodiment of the inventive concept.

FIG. 3 is a timing diagram for describing a normal operation of a semiconductor integrated circuit of FIG. 1, according to an exemplary embodiment of the inventive concept. In this example, it is assumed that a temperature of the control circuit 110 is lower than the low temperature $T_{low}$. "Chip Temp" may indicate a temperature of the control circuit 110 measured by the temperature sensor 111. "Frequency" may indicate a frequency of a clock signal generated by the clock generator 113. "$V_{dd1}$", "$V_{dd2}$", and "$V_{dd3}$" may indicate operating voltages supplied to the control circuit 110 from the power management IC 120. Below, an operation of the control circuit 110 at power-up will be described with reference to FIGS. 4A and 4B.

Referring to FIG. 3, the semiconductor integrated circuit 100 may control a temperature of the control circuit 110 to be within a set range, in other words, between the high temperature $T_{high}$ and the low temperature $T_{low}$.

Between 0 and t1, the controller 112 of the control circuit 110 may control the power management IC 120 such that the operating voltage $V_{dd1}$ is supplied to the control circuit 110.

At t1, in the event that the operating voltage $V_{dd1}$ is sufficiently supplied to the control circuit 110 for a normal operation of the control circuit 110 to begin, the controller 112 may control the power management IC 120 such that the operating voltage $V_{dd2}$ is supplied to the control circuit 110.

At t2, the temperature sensor 111 may detect that a temperature of the control circuit 110 is higher than the high temperature $T_{high}$. The controller 112 may receive temperature data $T_{dat}$ from the temperature sensor 111. Based on the temperature data $T_{dat}$ received from the temperature sensor 111, the controller 112 may control the clock generator 113 such that a frequency of a clock signal generated by the clock generator 113 is lowered. In addition, based on the temperature data $T_{dat}$ received from the temperature sensor 111, the controller 112 may control the power management IC 120 such that the operating voltage $V_{dd3}$ is supplied to the control circuit 110. For example, the controller 112 may control the clock generator 113 such that a frequency of a clock signal is lowered. After a time, the controller 112 may control the power management IC 120 such that the operating voltage $V_{dd3}$ is supplied to the control circuit 110.

At t3, the temperature sensor 111 may detect that a temperature of the control circuit 110 is lower than the high temperature $T_{high}$. The controller 112 may receive temperature data $T_{dat}$ from the temperature sensor 111. The controller 112 may control the power management IC 120 such that the operating voltage $V_{dd2}$ is supplied to the control circuit 110. After a time, the controller 112 may control the clock generator 113 such that a frequency of a clock signal increases.

At t4, the temperature sensor 111 may detect that a temperature of the control circuit 110 is higher than the high temperature $T_{high}$. An operation of the controller 112 at t4 may be equal to that at t2.

At t5, the temperature sensor 111 may detect that a temperature of the control circuit 110 is lower than the high temperature $T_{high}$. An operation of the controller 112 at t5 may be equal to that at t3.

At t6, the temperature sensor 111 may detect that a temperature of the control circuit 110 is lower than the low temperature $T_{low}$. The controller 112 may receive temperature data $T_{dat}$ from the temperature sensor 111. The controller 112 may control the power management IC 120 such that an operating voltage higher than the operating voltage $V_{dd2}$ is supplied to the control circuit 110. For example, the controller 112 may control the power management IC 120 such that the operating voltage $V_{dd1}$ is supplied to the control circuit 110. In addition, the controller 112 may control the body bias generator 114 such that a forward body bias voltage is supplied to the processor unit 115, independently from the power management IC 120.

At t7, the temperature sensor 111 may detect that a temperature of the control circuit 110 is higher than the low temperature $T_{low}$. The controller 112 may receive temperature data $T_{dat}$ from the temperature sensor 111. The controller 112 may control the power management IC 120 such that the operating voltage $V_{dd2}$ is supplied to the control circuit 110.

Figure 4A:
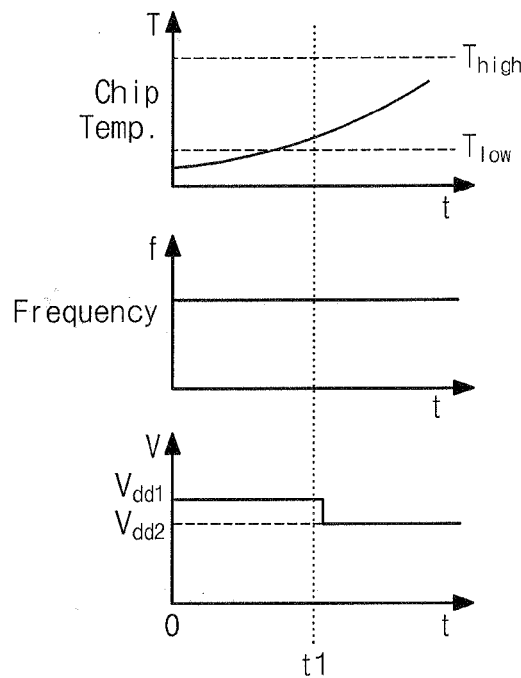
FIGS. 4A and 4B are timing diagrams for describing an operation of a semiconductor integrated circuit of FIG. 1 at power-up, according to an exemplary embodiment of the inventive concept.
Figure 4B:
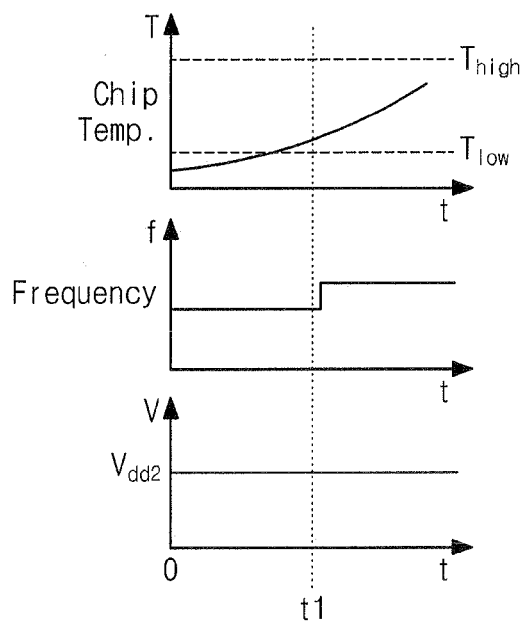

FIGS. 4A and 4B are timing diagrams for describing an operation of a semiconductor integrated circuit of FIG. 1 at power-up, according to an exemplary embodiment of the inventive concept. At t1 in FIGS. 4A and 4B, the control circuit 110 is sufficiently supplied with an operating voltage such that it may operate normally.

Referring to FIG. 4A, at power-up of the control circuit 110, the controller 112 may control the power management IC 120 such that the operating voltage $V_{dd1}$ is supplied to the control circuit 110. The operating voltage $V_{dd1}$ may be higher than the operating voltage $V_{dd2}$ at a normal operation of the control circuit 110. The operating voltage $V_{dd1}$ at power-up is greater than the operating voltage $V_{dd2}$ in a normal operation to compensate for the lowering of the performance (e.g., a decrease in an operating speed) of the control circuit 110 in a case where a temperature of the control circuit 110 is lower than the low temperature $T_{low}$ before the temperature sensor 111 can normally operate (e.g., be supplied with a sufficient operating voltage).

Referring to FIG. 4B, at power-up of the control circuit 110, the controller 112 may control the clock generator 113 such that a frequency of a clock signal generated at power-up of the control circuit 110 is lower than that a frequency of a clock signal generated at a normal operation of the control circuit 110. In this case, a setup time error of the control circuit 110 generated due to the lowering of an operating speed when a temperature of the control circuit 110 is lower than the low temperature $T_{low}$ may be prevented. The clock signal is decreased by lowering its frequency with the clock generator 113.

Figure 5:
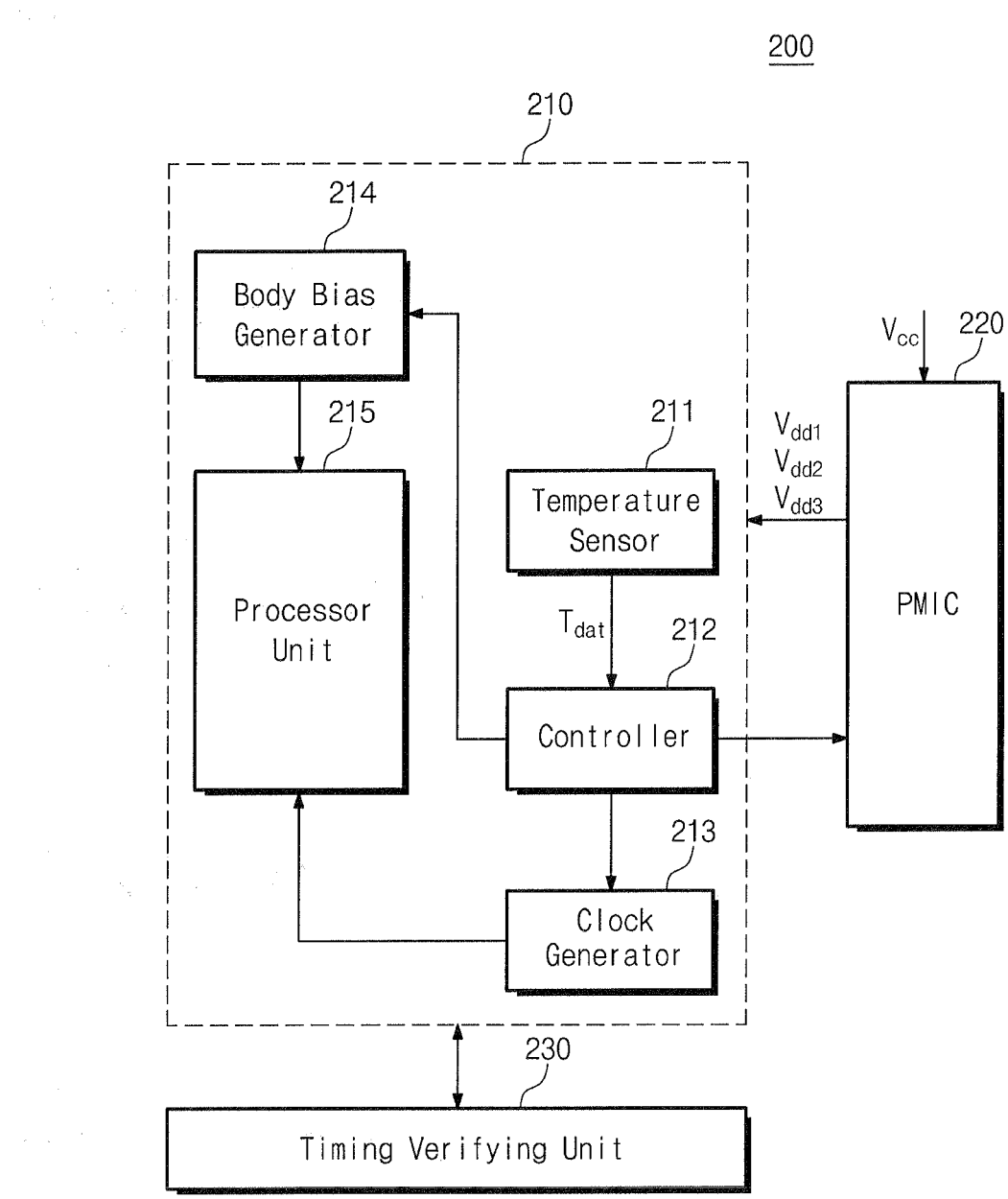
FIG. 5 is a block diagram illustrating a semiconductor integrated circuit according to an exemplary embodiment of the inventive concept.
Figure 6:
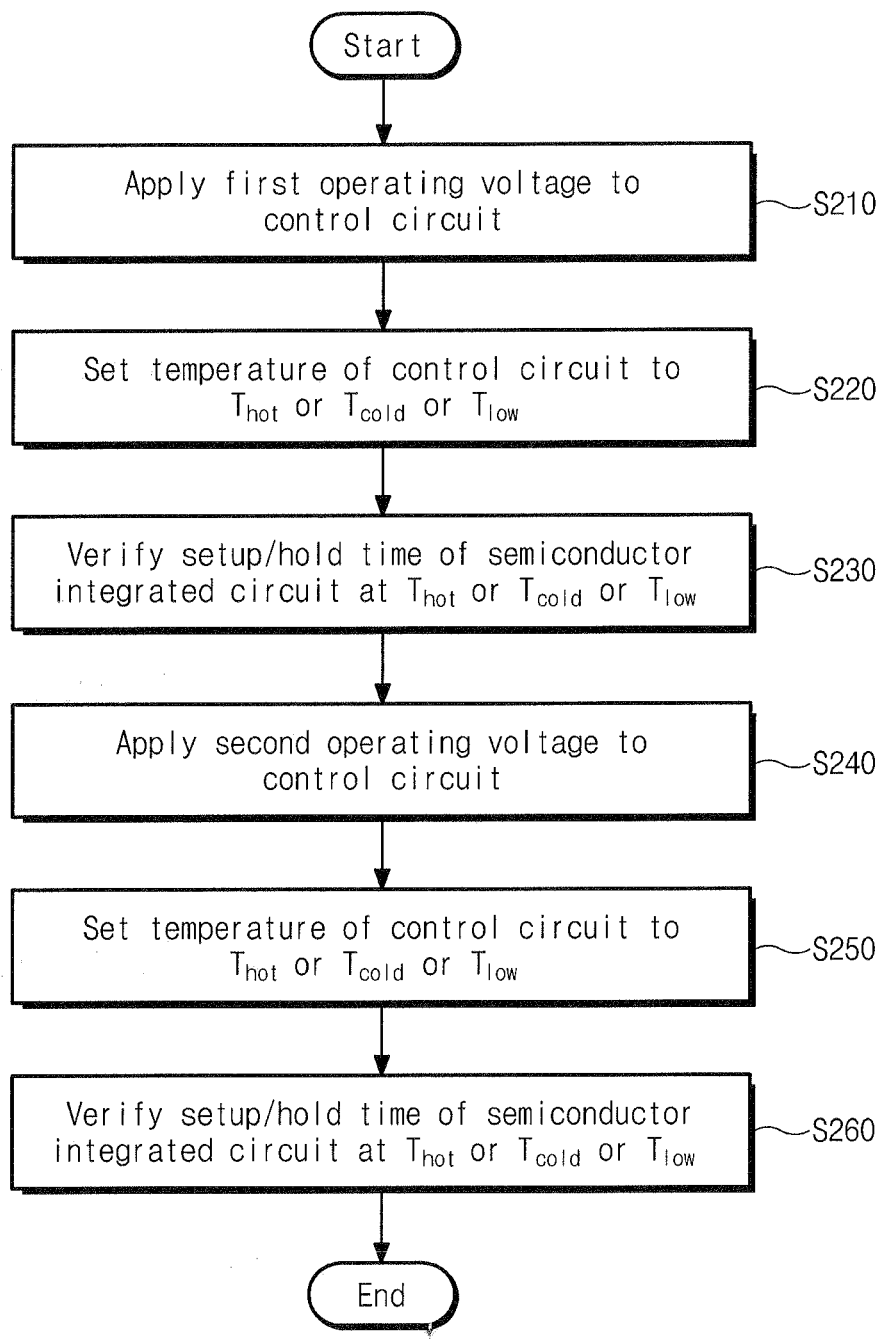
FIG. 6 is a flowchart illustrating a timing verifying method of a semiconductor integrated circuit of FIG. 6, according to an exemplary embodiment of the inventive concept.

FIG. 5 is a block diagram illustrating a semiconductor integrated circuit according to an exemplary embodiment of the inventive concept. FIG. 6 is a flowchart illustrating a timing verifying method of a semiconductor integrated circuit of FIG. 5, according to an exemplary embodiment of the inventive concept. FIG. 7 is a table for describing a timing verifying method of a semiconductor integrated circuit of FIG. 6, according to an exemplary embodiment of the inventive concept.

Referring to FIG. 5, a semiconductor integrated circuit 200 may further comprise a timing verifying unit 230 compared with the semiconductor integrated circuit 100 of FIG. 1. Similar to the semiconductor integrated circuit 100 of FIG. 1, the semiconductor integrated circuit 200 includes a control circuit 210 and a power management IC 220. The control circuit 210 includes a temperature sensor 211, a controller 212, a clock generator 213, a body bias generator 214, and a processor unit 215. These components may be substantially the same as those described above with reference to FIG. 1.

The timing verifying unit 230 may perform a static timing analysis (STA) on the semiconductor integrated circuit 200. The static timing analysis (STA) may analyze timing between signals output from and input to a designed semiconductor circuit or logic and test whether the designed semiconductor circuit or logic operates normally without a problem associated with timing. The static timing analysis (STA) may be executed at a semiconductor circuit design level, and may be used to determine whether a designed semiconductor circuit is abnormal or not.

For the static timing analysis (STA), the timing verifying unit 230 may verify a setup time and a hold time of the semiconductor integrated circuit 200. In other words, the timing verifying unit 230 may verify a setup time and a hold time of the semiconductor integrated circuit 200 in consideration of a specific temperature, a specific operating voltage, elements (e.g., logic gates) of an integrated circuit, parasitic resistance components of wires, and so on.

Referring to FIG. 6, a timing verifying method of the semiconductor integrated circuit 200 may include supplying a first operating voltage to the control circuit 210 (S210); setting a temperature of the control circuit 210 to a hot temperature $T_{hot}$, a cold temperature $T_{cold}$ or a low temperature $T_{low}$ higher than the cold temperature $T_{cold}$ and lower than the hot temperature $T_{hot}$ (S220); verifying a setup/hold time of the semiconductor integrated circuit 200 at the hot temperature $T_{hot}$, the cold temperature $T_{cold}$ or the low temperature $T_{low}$ (S230); supplying a second operating voltage to the control circuit 210 (S240); setting a temperature of the control circuit 210 to the hot temperature $T_{hot}$, the cold temperature $T_{cold}$ or the low temperature $T_{low}$ (S250); and verifying a setup/hold time of the semiconductor integrated circuit 200 at the hot temperature $T_{hot}$, the cold temperature $T_{cold}$ or the low temperature $T_{low}$ (S260).

Referring to FIGS. 6 and 7, in operation S230, the timing verifying unit 230 may verify a setup/hold time with respect to a case where an operating speed of a cell (e.g., a logic gate) is slowest (e.g., worst) at the hot temperature $T_{hot}$, the cold temperature $T_{cold}$ and the low temperature $T_{low}$ and a case where parasitic resistance components of wires (e.g., data and clock signal wires) are largest (e.g., worst) at the hot temperature $T_{hot}$, the cold temperature $T_{cold}$ and the low temperature $T_{low}$, while a first operating voltage (Vdd-α %) is applied to the control circuit 210. Here, "Vdd" may indicate an operating voltage supplied to the control circuit 210.

For example, with the timing verifying method of the semiconductor integrated circuit 200, a setup time may be verified in consideration of a cell operating speed at the low temperature $T_{low}$ and a parasitic resistance component of a wire at the low temperature $T_{low}$. In other words, it is possible to verify the setup time of the semiconductor integrated circuit 200 at the low temperature $T_{low}$ higher than the cold temperature $T_{cold}$ and lower than the hot temperature $T_{hot}$. The setup time of the semiconductor integrated circuit 200 at the low temperature $T_{low}$ may be faster than that at the cold temperature $T_{cold}$.

In operation S260, the timing verifying unit 230 may verify a setup/hold time with respect to a case where an operating speed of a cell (e.g., a logic gate) is fastest (e.g., best) at the hot temperature $T_{hot}$, the cold temperature $T_{odd}$ and the low temperature $T_{low}$ and a case where parasitic resistance components of wires (e.g., data and clock signal wires) are smallest (e.g., best) at the hot temperature $T_{hot}$, the cold temperature $T_{cold}$ and the low temperature $T_{low}$, while a second operating voltage (Vdd+α %) is applied to the control circuit 210.

Figure 8:
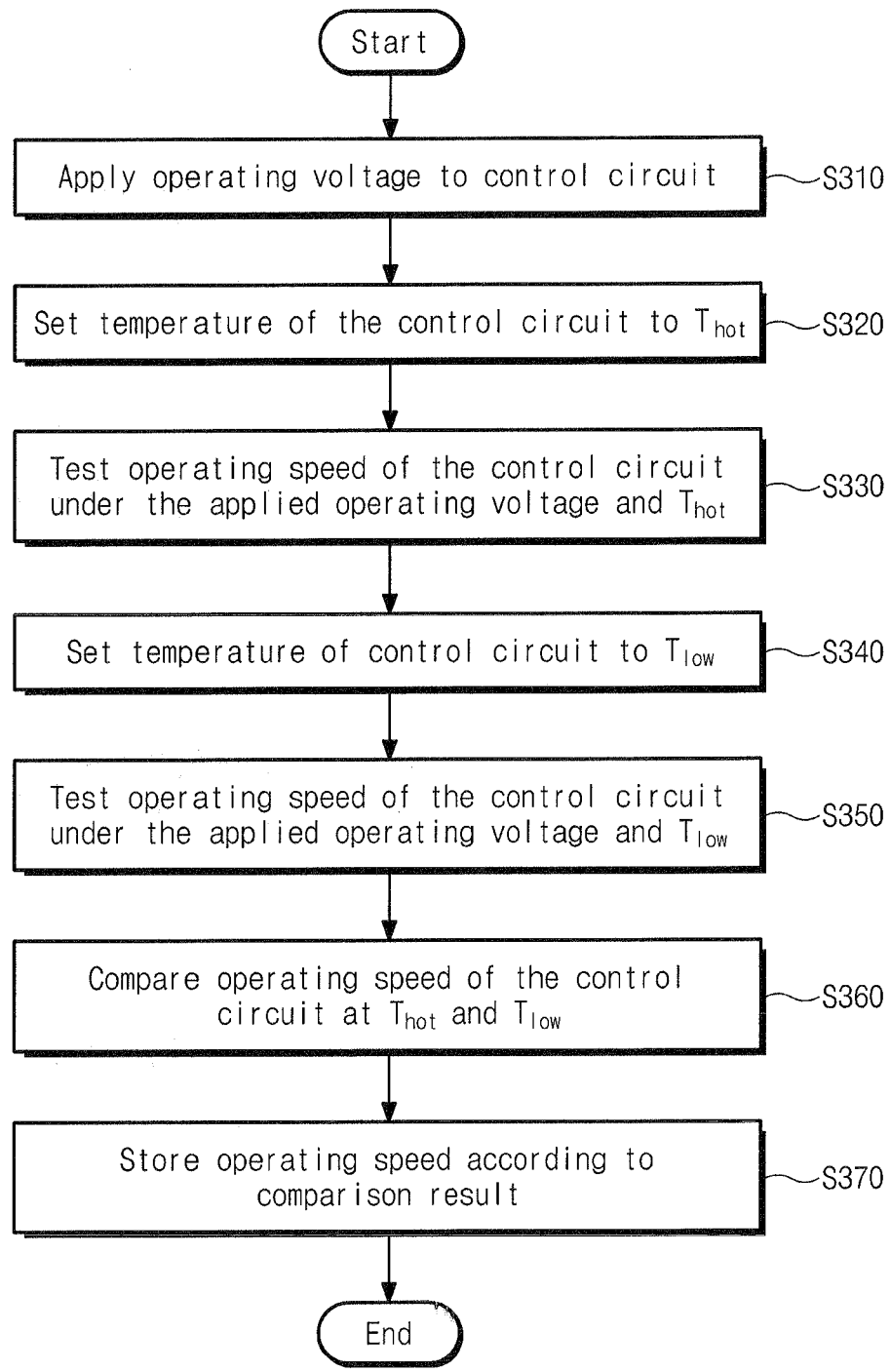
FIG. 8 is a flowchart illustrating a test method of a semiconductor integrated circuit according to an exemplary embodiment of the inventive concept.
Figure 9:
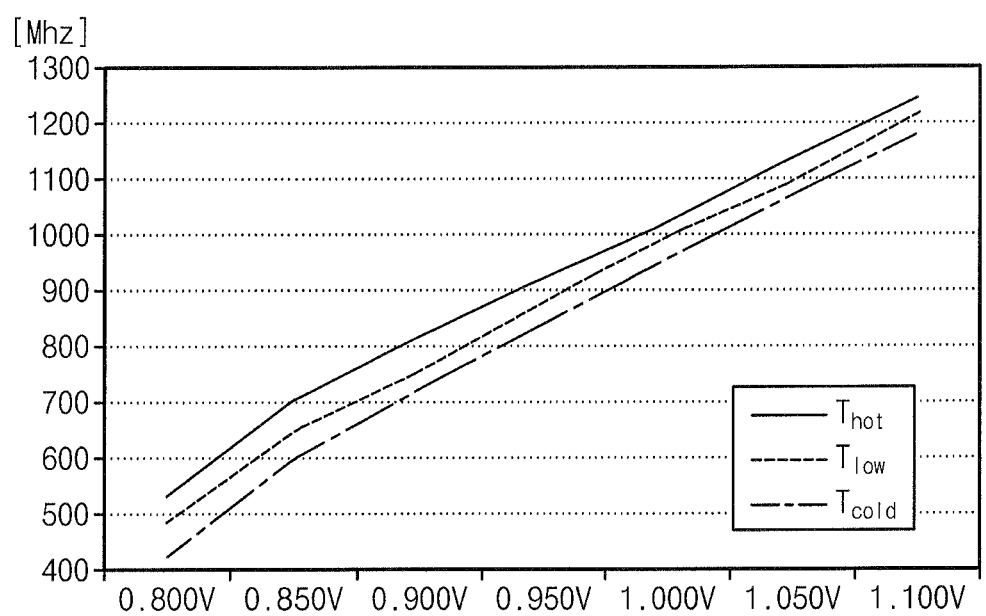
FIG. 9 is a diagram illustrating a test result of a semiconductor integrated circuit according to an exemplary embodiment of the inventive concept.

FIG. 8 is a flowchart illustrating a test method of a semiconductor integrated circuit according to an exemplary embodiment of the inventive concept. FIG. 9 is a diagram illustrating a test result of a semiconductor integrated circuit according to an exemplary embodiment of the inventive concept.

Referring to FIG. 8, a test method of a semiconductor integrated circuit according to an exemplary embodiment of the inventive concept may include applying an operating voltage to the control circuit 110 (refer to FIG. 1) (S310); setting a temperature of the control circuit 110 to the hot temperature $T_{hot}$ (S320); checking an operating speed of the control circuit 110 at the hot temperature $T_{hot}$ at the applied operating voltage (S330); setting a temperature of the control circuit 110 to the low temperature $T_{low}$ higher than the cold temperature $T_{cold}$ and lower than the hot temperature $T_{hot}$ (S340); and checking an operating speed of the control circuit 110 at the low temperature $T_{low}$ at the applied operating voltage (S350).

In addition, the test method of the semiconductor integrated circuit may further comprise comparing an operating speed of the control circuit 110 at the hot temperature $T_{hot}$ and an operating speed of the control circuit 110 at the low temperature $T_{low}$ (S360); and storing an operating speed of the control circuit 110 at the applied operating voltage at the hot temperature $T_{hot}$ or the low temperature $T_{low}$ according to a comparison result (S370). A slower operating speed is stored according to the comparison result at the hot temperature $T_{hot}$ or the low temperature $T_{low}$.

In operation 3370, dynamic voltage frequency scaling (DVFS) information may be generated.

In general, a semiconductor integrated circuit may be tested at the hot temperature $T_{hot}$ and the cold temperature $T_{cold}$ of the control circuit 110. The dynamic voltage frequency scaling (DVFS) information may be generated on the basis of an operating voltage at a temperature at which an operating speed is slow, according to the test result at the hot temperature $T_{hot}$ and the cold temperature $T_{cold}$. However, with the test method of the semiconductor integrated circuit according to an exemplary embodiment of the inventive concept, the dynamic voltage frequency scaling (DVFS) information may be generated on the basis of an operating voltage at a temperature at which an operating speed is slow, according to the test result at the low temperature $T_{low}$ higher than the cold temperature $T_{cold}$ yet less than the hot temperature $T_{hot}$.

Referring to FIG. 9, there is illustrated a variation in an operating speed according to an operating voltage applied to the control circuit 110. In the event that an operating voltage having the same level is applied to the control circuit 110, an operating speed may be fastest at the hot temperature $T_{hot}$. On the other hand, an operating speed may be slowest at the cold temperature $T_{cold}$. In addition, an operating speed at the low temperature $T_{low}$ may be faster than that at the cold temperature $T_{cold}$. In other words, the same operating speed (ex. 500 Mhz) may be implemented at a lower operating voltage at the low temperature $T_{low}$.

For example, with the test method of the semiconductor integrated circuit according to an exemplary embodiment of the inventive concept, an operating speed at the low temperature $T_{low}$ may be checked, and a result of the checking may be used as dynamic voltage frequency scaling (DVFS) information. Since a required operating speed of the control circuit 110 is obtained using a lower operating voltage, power consumption of the semiconductor integrated circuit according to an exemplary embodiment of the inventive concept may be reduced.

In exemplary embodiments of the inventive concept, a semiconductor integrated circuit may control a temperature to be within a constant range during normal operation. For example, the semiconductor integrated circuit may lower a temperature of the semiconductor integrated circuit when a temperature exceeds a high temperature value. When a temperature is lower than a low temperature value, the semiconductor integrated circuit may compensate for a decrease in a speed of the semiconductor integrated circuit through an increase in operating voltage, for example.

While the inventive concept has been shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A semiconductor integrated circuit, comprising;
   a control circuit; and
   a power management integrated circuit (IC) configured to supply an operating voltage to the control circuit, wherein the control circuit comprises:
a clock generator configured to generate a clock signal;
a processor unit configured to operate in response to the clock signal and to operate the control circuit;
a temperature sensor configured to sense a temperature of the control circuit to generate temperature data;
a body bias generator configured to supply a body bias voltage to the processor unit; and
a controller configured to receive the temperature data from the temperature sensor,
wherein the controller controls the power management IC and the clock generator when the temperature data indicates a temperature higher than a high temperature and controls the power management IC or the body bias generator when the temperature data indicates a temperature lower than a low temperature; and
wherein the high temperature is lower than a hot temperature of the control circuit and the low temperature is higher than a cold temperature of the control circuit and lower than the high temperature.

2. The semiconductor integrated circuit of claim 1, wherein when the temperature data indicates a temperature lower than the low temperature, the controller controls the power management IC to increase the operating voltage.

3. The semiconductor integrated circuit of claim 1, wherein when the temperature data indicates a temperature lower than the low temperature, the controller controls the body bias generator to supply a forward body bias voltage to the processor unit.

4. The semiconductor integrated circuit of claim 1, wherein when the temperature data indicates a temperature higher than the high temperature, the controller controls the power management IC to decrease the operating voltage and the clock generator to decrease a frequency of the clock signal.

5. The semiconductor integrated circuit of claim 4, wherein when the temperature data indicates a temperature higher than the high temperature, the frequency of the clock signal is decreased before the operating voltage is decreased.

6. The semiconductor integrated circuit of claim 1, wherein at power-up of the control circuit, the controller controls the power management IC to supply the control circuit with an operating voltage higher than an operating voltage supplied to the control circuit at a normal operation.

7. The semiconductor integrated circuit of claim 1, wherein at power-up of the control circuit, the controller controls the clock generator to lower a frequency of the clock signal.

8. The semiconductor integrated circuit of claim 1, wherein at power-up of the control circuit, the controller controls the body bias generator to supply a forward body bias voltage to the processor unit.

9. An operating method of a semiconductor integrated circuit which includes a control circuit, comprising:
receiving power at the control circuit;
operating the control circuit at an initial condition in response to the received power;
sensing a temperature of the control circuit at a normal operation of the control circuit;
determining whether the sensed temperature of the control circuit is higher than a high temperature or lower than a low temperature; and
controlling an operating voltage of the control circuit according to the determination result,
wherein the high temperature is lower than a hot temperature of the control circuit and the low temperature is higher than a cold temperature of the control circuit and lower than the high temperature.

10. The operating method of claim 9, wherein controlling the operating voltage of the control circuit according to the determination result comprises:
instructing a power management integrated circuit (IC) of the semiconductor integrated circuit to increase the operating voltage when the sensed temperature of the control circuit is lower than the low temperature.

11. The operating method of claim 9, wherein controlling the operating voltage of the control circuit according to the determination result comprises:
decreasing a frequency of a clock signal generated by the control circuit when the sensed temperature of the control circuit is higher than the high temperature; and
instructing a power management integrated circuit (IC) of the semiconductor integrated circuit to decrease the operating voltage when the sensed temperature of the control circuit is higher than the high temperature.

12. A timing verifying method of a semiconductor integrated circuit which includes a control circuit, comprising:
receiving a first operating voltage at the control circuit;
setting a temperature of the control circuit to a hot temperature, a cold temperature or a low temperature higher than the cold temperature and lower than the hot temperature;
verifying a setup/hold time of the semiconductor integrated circuit at the hot temperature, the cold temperature or the low temperature;
receiving a second operating voltage at the control circuit;
setting a temperature of the control circuit to the hot temperature, the cold temperature or the low temperature; and
verifying a setup/hold time of the semiconductor integrated circuit at the hot temperature, the cold temperature or the low temperature.

13. The timing verifying method of claim 12, wherein the first operating voltage is lower than the second operating voltage.

14. A test method of a semiconductor integrated circuit which includes a control circuit, comprising:
receiving an operating voltage at the control circuit;
setting a temperature of the control circuit to a hot temperature;
checking an operating speed of the control circuit at the hot temperature at the received operating voltage;
setting a temperature of the control circuit to a low temperature higher than a cold temperature and lower than the hot temperature; and
checking an operating speed of the control circuit at the low temperature at the received operating voltage.

15. The test method of claim 14, further comprising;
comparing an operating speed of the control circuit at the hot temperature and an operating speed of the control circuit at the low temperature; and
storing the operating speed at the hot temperature or the low temperature according to the comparison result.

16. A semiconductor integrated circuit, comprising;
a control circuit; and
a power management circuit,
wherein the control circuit is configured to reduce a speed of a clock signal and the power management circuit is configured to reduce a level of an operating voltage supplied to the control circuit in response to a temperature of the control circuit exceeding a first temperature threshold, wherein the first temperature threshold is lower than a maximum operating temperature of the control circuit and greater than a minimum operating temperature of the control circuit, wherein the control circuit includes a controller configured to control the power management circuit to adjust the level of the operating voltage and to control a clock generator to adjust the speed of the clock signal.

17. The semiconductor integrated circuit of claim 16, wherein the control circuit is configured to generate a bias body voltage or the power management circuit is configured to increase the level of the operating voltage in response to the temperature of the control circuit being lower than a second temperature threshold, the second temperature threshold being less than the first temperature threshold and greater than the minimum operating temperature of the control circuit.

18. The semiconductor integrated circuit of claim 16, further comprising a timing verifying unit.

19. The semiconductor integrated circuit of claim 16, wherein the controller is configured to control a body bias generator to generate a body bias voltage.

* * * * *